US005952899A

United States Patent [19]

Kadota et al.

[11] Patent Number: 5,952,899

[45] Date of Patent: Sep. 14, 1999

[54] LADDER FILTER HAVING EDGE REFLECTION TYPE SAW RESONATORS

[75] Inventors: Michio Kadota, Kyoto; Takeshi Nadota, Nagaokakyo; Toshimaro Yoneda, Nagaokakyo; Junya Ago, Nagaokakyo, all of Japan

[73] Assignee: Murata Manufacturing Co., Ltd., Kyoto-fu, Japan

[21] Appl. No.: 09/076,531

[22] Filed: May 12, 1998

[30] Foreign Application Priority Data

May 16, 1997 [JP] Japan .................................... 9-127393

[51] Int. Cl.[6] ....................................................... H03H 9/64

[52] U.S. Cl. .......................... 333/193; 333/133; 333/195; 310/313 B

[58] Field of Search .................................... 333/193–196, 333/133; 310/313 R, 313 B, 313 C, 313 D

[56] References Cited

U.S. PATENT DOCUMENTS

| | | | |
|---|---|---|---|
| 5,184,042 | 2/1993 | Kadota et al. | 310/313 A |
| 5,682,126 | 10/1997 | Plesski et al. | 333/193 |
| 5,684,437 | 11/1997 | Ago et al. | 333/193 X |
| 5,714,830 | 2/1998 | Kadota et al. | 310/313 B X |
| 5,767,603 | 6/1998 | Kadota et al. | 310/313 R X |
| 5,781,083 | 7/1998 | Horiuchi et al. | 333/193 X |
| 5,793,147 | 8/1998 | Kadota et al. | 310/313 B X |

FOREIGN PATENT DOCUMENTS

| | | | |
|---|---|---|---|
| 54051759 | 4/1979 | Japan . | |
| 5-183380 | 7/1993 | Japan . | |
| 5-291869 | 11/1993 | Japan | 310/313 B |

OTHER PUBLICATIONS

M. Kadota et al., IEEE Transactions on Microwave Theory and Techniques, vol. 44, No 12, Dec. 1996–"A Bleustein–Gulyaev–Shimizu Wave Resonator Having Resonances for TV and VCR Traps" pp. 2758–2762.

*Primary Examiner*—Robert Pascal
*Assistant Examiner*—Barbara Summons
*Attorney, Agent, or Firm*—Graham & James LLP

[57] ABSTRACT

A ladder filter includes a plurality of series arm resonators and a plurality of parallel arm resonators. The series arm resonators are connected in series to form a series arm of a ladder circuit and are located at a first integrated region. Each series arm resonator includes an edge-reflection surface acoustic wave (SAW) resonator which has a piezoelectric material portion and a pair of edges thereof and utilizes a shear horizontal surface acoustic wave to be excited on the piezoelectric material portion. Each of the parallel arm resonators is connected in parallel between the series arm and a ground potential to form a parallel arm of a ladder circuit. Each of the parallel arm resonators includes an edge reflection SAW resonator which has a piezoelectric material portion with a pair of edges thereof and utilizes a shear horizontal surface acoustic wave to be excited on the piezoelectric material portion. The parallel arm resonators include a first group of at least two parallel arm resonators which are located at a second integrated region which is physically isolated from the first integrated region such that the shear horizontal surface acoustic wave excited on the piezoelectric material portion in the first integrated region does not interfere with the shear horizontal type surface acoustic wave excited in the second integrated region.

24 Claims, 11 Drawing Sheets

LADDER FILTER HAVING EDGE REFLECTION TYPE SAW RESONATORS

BACKGROUND OF THE INVENTION

1. Field of the Invention

The present invention relates to a ladder filter, and more particularly to a ladder filter having a plurality of edge-reflection type surface acoustic wave resonators.

2. Description of Related Art

A surface acoustic wave filter (SAW) in which a plurality of SAW resonator are arranged to define a ladder circuit is known and referred to as a ladder filter. FIG. 1A shows a conventional ladder filter 201 disclosed in Japanese Laid-open patent application No. 5-183380, and FIG. 1B is an equivalent circuit thereof. The ladder filter 201 includes a piezoelectric substrate 202 and series one-port SAW resonators 203 and 204 and parallel one-port SAW resonators 205 to 207 disposed on the piezoelectric substrate 202. The series one-port SAW resonators 203 and 204 are connected in series between an input terminal IN and an output terminal OUT to define a series arm, and parallel one-port SAW resonators 205 to 207 are respectively connected in parallel between the series arm and a ground potential to each define a parallel arm.

As shown in FIG. 1A, the SAW resonators 203 to 207 each includes a respective pair of interdigital transducers (IDTs) 203*a* to 207*a* and a respective pair of grating reflectors 203*b* to 207*b* disposed on opposite sides thereof. In the SAW resonators 203 to 207, surface acoustic waves excited by the IDTs 203*a* to 207*a* are confined between the grating reflectors 203*b* to 207*b* so as to form standing waves. Each of the resonators 203 to 207 has a resonance characteristic in which the impedance of the resonator is low in the vicinity of a resonant frequency and the impedance is high in the vicinity of an antiresonant frequency.

In the ladder filter 201, the resonant frequency of series one-port resonators 203 and 204 are constructed to be coincident with the antiresonant frequency of the parallel one-port resonators 205 to 207. Thus, the ladder filter 201 is provided within a passband defined by the antiresonant frequency of the series one-port resonators 203 and 204 and the resonant frequency of the parallel one-port resonators 205 to 207.

The conventional ladder filter 201, and the ladder filter of this type has been widely applied to a TV set, VCR, communication device such as a cellular phone or the like. However, there has been a continuous demand for improving the performance of such a ladder filter and miniaturizing such a ladder filter.

SUMMARY OF THE INVENTION

The preferred embodiments of the present invention provide a ladder filter which overcomes the problems with conventional devices described above and achieves significantly improved performance while also achieving a significantly reduced size.

A ladder filter according to one preferred embodiment of the present invention includes a plurality of series arm resonators and a plurality of parallel arm resonators. The series arm resonators are connected in series to define a series arm of a ladder circuit located in a first integrated region. Each series arm resonator preferably includes an edge-reflection surface acoustic wave (SAW) resonator which includes a piezoelectric material portion with a pair of edges thereof and utilizes a shear horizontal surface acoustic wave to be excited on the piezoelectric material portion. Each parallel arm resonator is connected in parallel between the series arm and a ground potential to define a parallel arm of a ladder circuit and includes an edge reflection SAW resonator which includes a piezoelectric material portion with a pair of edges thereof and utilizes a SH-type surface acoustic wave to be excited on the piezoelectric material portion. The parallel arm resonators include a first group of at least two parallel arm resonators which are located at a second integrated region that is physically isolated from the first integrated region such that the shear horizontal type surface acoustic wave excited on the piezoelectric material portion in the first integrated region does not interfere with the shear horizontal type surface acoustic wave excited in the second integrated region.

The plurality of series arm resonators are preferably located in the first integrated region such that the pair of edges of each series arm resonator are flush with the corresponding edges of the other series arm resonators, and the at least two parallel arm resonators of the first group are arranged such that the pair of edges of each parallel arm resonator of the first group is flush with the corresponding edges of the other parallel arm resonators of the first group.

The parallel arm resonators may further include a second group of at least two parallel arm resonators selected from the remaining parallel arm resonators. The at least two parallel arm resonators of the second group are located at a third integrated region which is physically isolated form the first and second integrated regions such that the shear horizontal type surface acoustic waves excited on the piezoelectric material portion in the third integrated region do not interfere the shear horizontal type surface acoustic waves excited in the first and second integrated regions.

The at least two parallel arm resonators of the second group are preferably arranged such that the pair of edges of each parallel arm resonator of the second group are flush with the corresponding edges of the other parallel arm resonators of the second group.

The ladder filter may include first and second single substrates made of piezoelectric material, and the first and second integrated regions are located on the first and second single substrates, respectively.

Alternatively, the ladder filter may include first, second and third single substrates made of piezoelectric material, and the first, second and third integrated regions are located on the first, second and third single substrates, respectively, and the first single substrate is arranged between the second single substrate and the third single substrate.

Alternatively, the ladder filter may include a single substrate which is made of piezoelectric material and has a groove structure thereon to divide the single substrate into two main regions located on opposite sides of the groove structure. The first and second integrated regions are located in the divided two main regions of the single substrate, respectively.

Alternatively, the ladder filter may include a single substrate made of piezoelectric material and having two substantially parallel grooves thereon to divide the single substrate into three main regions. The first integrated region is located in one of the main regions of the single substrate located between the two grooves structure. The second and third integrated regions are located in the remaining two main regions of the single substrate, respectively.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

The inventors of the present invention have studied edge reflection type SAW resonators as disclosed in U.S. Pat. No. 5,184,042 and IEEE Transactions on Microwave Theory and Technique, Vol. 44, No. 12, 1996, and have discovered that edge reflection type SAW resonators can be applied to a ladder filter.

The present inventors discovered that the conventional ladder filter suffers from the problems associated with the grating reflectors of SAW resonators. More specifically, the grating reflectors are relatively large compared to the size of IDTs, which may prevent miniaturization of the ladder filter. In addition, the grating reflectors have poor reflectivity, which may cause a narrow pass band width and large insertion loss.

On the contrary, an edge reflection type SAW resonator has no grating reflectors, and reflection of a surface acoustic wave at the edges thereof is almost perfect. Therefore, a ladder filter can be improved in accordance with the aforementioned demand by using an edge reflection type SAW filter.

An edge-reflection type SAW resonator uses end surfaces of a piezoelectric substrate to reflect a surface acoustic wave, and the distance between the end surfaces is set at a specific value which is determined by a frequency characteristic of the edge-reflection SAW resonator. This means only one edge-reflection SAW resonator can be formed on one substrate, and the size of the substrate differs based on the frequency characteristic of the edge-reflection SAW resonator. This requirement does not permit integrating a plurality of edge-reflection type SAW resonators. The inventors have solved this problem successfully as explained below in detail.

Hereinafter, preferred embodiments of the present invention are explained in detail with reference to the drawings.

Figure 1A:
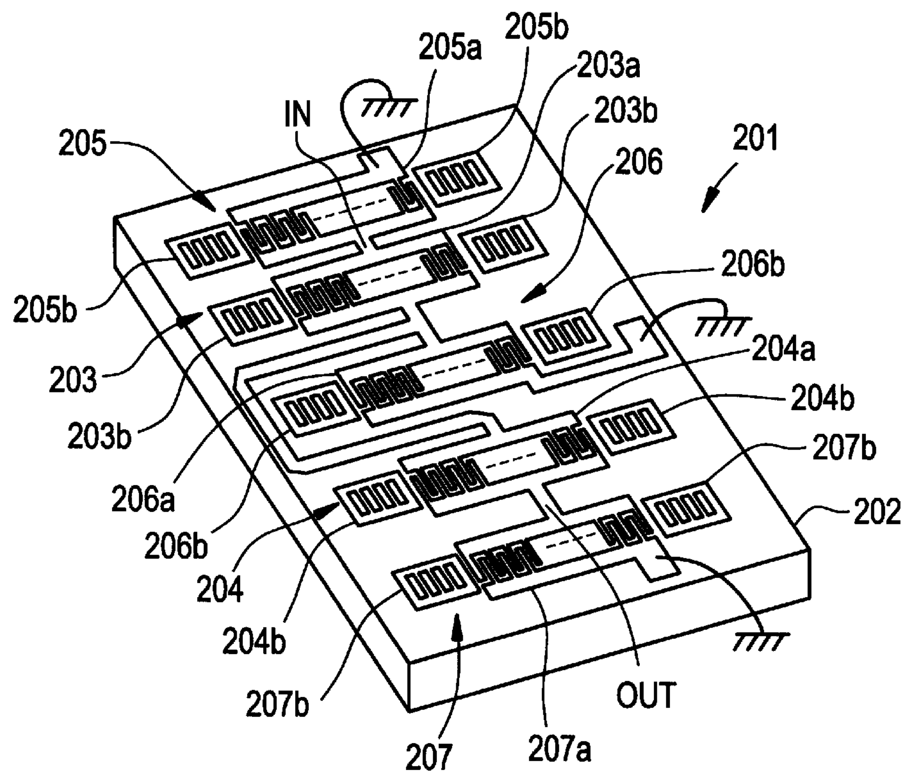
FIG. 1A is a perspective view showing a conventional ladder filter.
Figure 1B:
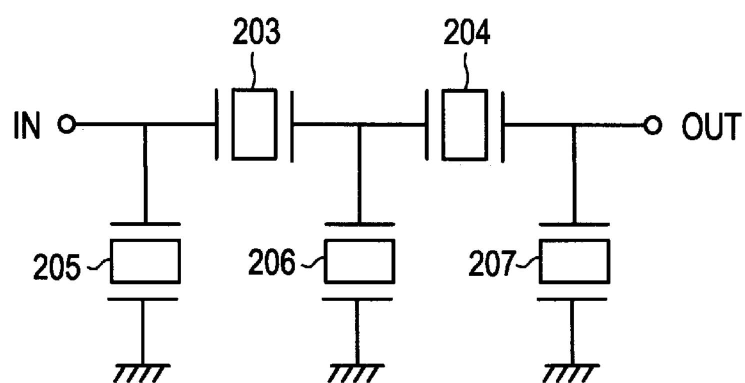
FIG. 1B is an equivalent circuit of the ladder filter shown in FIG. 1A.
Figure 2:
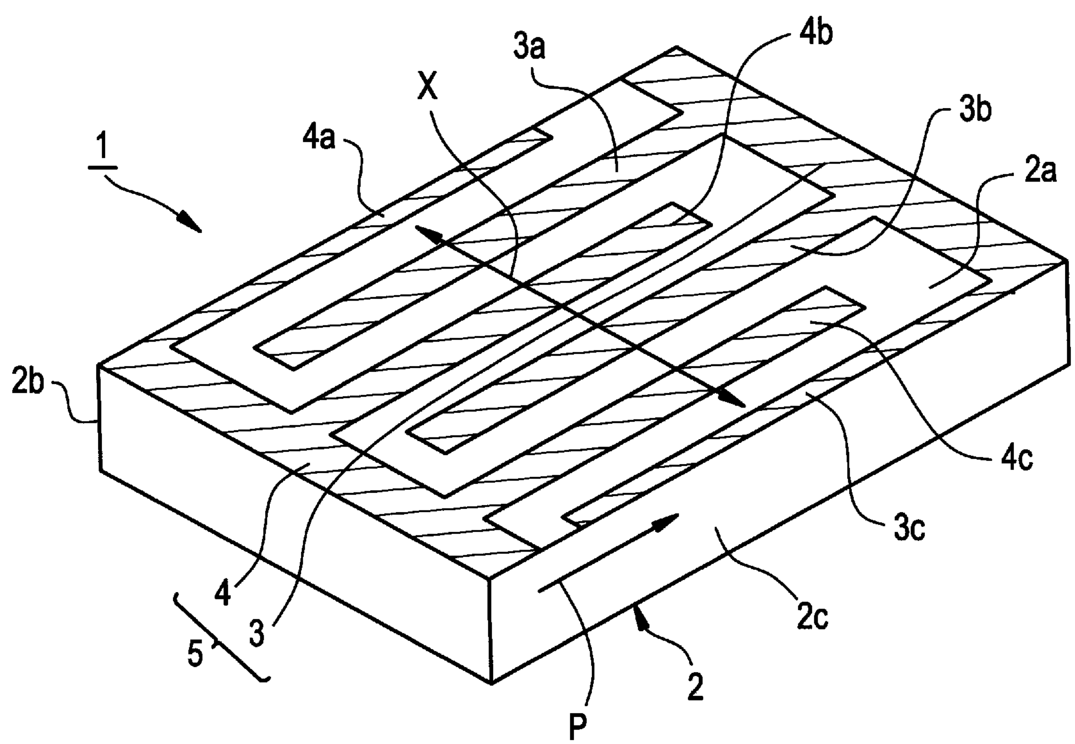
FIG. 2 is a perspective view of an edge-reflection type surface acoustic wave resonator used in the ladder filter according to preferred embodiments of the present invention.

FIG. 2 is a perspective view illustrating an example of an edge-reflection type surface acoustic wave (SAW) resonator 1 which is a one-port resonator and is used as a parallel arm resonator and a series arm resonator in a ladder filter according to preferred embodiments of the present invention. The edge-reflection type SAW resonator 1 preferably utilizes a shear horizontal (SH) surface wave. In this specification, an SH surface acoustic wave is defined as a surface acoustic wave which experiences displacement in a direction that is substantially perpendicular to the propagating direction of the surface acoustic wave and is substantially parallel to the surface of a substrate on which the SH surface acoustic wave is excited. For example, such SH surface waves includes SH leaky waves, Love waves and BGS (Bleustein-Gulyaev-Shimizu) waves.

The edge-reflection SAW resonator 1 includes a piezoelectric substrate 2 and an interdigital transducer (IDT) 5. The piezoelectric substrate 2 has a pair of substantially parallel end surfaces 2*b* and 2*c* and is preferably made of a piezoelectric material, such as a lead titanate zirconate piezoelectric ceramic, a $LiNbO_3$ piezoelectric single crystal, a $LiTaO_3$ piezoelectric single crystal, or quartz single crystal. In the case where the substrate 2 is made of piezoelectric ceramics, the substrate 2 is polarized in the direction indicated by the arrow P shown in FIG. 2.

The IDT 5 has a pair of comb-shaped electrodes 3 and 4 disposed on the upper surface of the substrate 2*a* and interdigitated with each other. The comb-shaped electrodes 3 and 4 include a plurality of electrode fingers 3*a*, 3*b*, 3*c* and 4*a*, 4*b*, 4*c*, respectively. A pair of outermost electrode fingers 4*a* and 3*c* are flush with the end surfaces 2*b* and 2*c*, respectively. Although, one electrode finger of the comb-shaped electrode 3 and one electrode finger of the comb-shaped electrode 4 are located at the outermost position of the IDT 5, a pair of the electrode fingers of the comb-shaped electrode 3 or 4 may be located at the outermost position. The space between the electrode fingers and the width of the electrode fingers except the outermost electrode fingers 4*a* and 3*c* are preferably set at about $\lambda/4$, where $\lambda$ is a wavelength of the SH type wave to be excited on the substrate 2. The width of the outermost electrode fingers 4*a* and 3*c* is preferably set at about $\lambda/8$.

Upon application of an alternating current voltage from the comb-shaped electrodes 3 and 4, the SH wave is excited in the edge-reflection SAW resonator 1 and propagates in the direction which is substantially perpendicular to the end surfaces 2*b* and 2*c,* as indicated by the arrow X in FIG. 2. The SH wave is reflected between two opposing end surfaces 2*b* and 2*c* of the piezoelectric substrate 2.

In the above-described edge-reflection SAW resonator 1, the resonant frequency determined by the IDT is matched to the frequency determined by the distance between the opposing two end surfaces 2*b* and 2*c,* thereby achieving effective resonance characteristics having a resonant frequency and an antiresonant frequency.

Figure 3A:
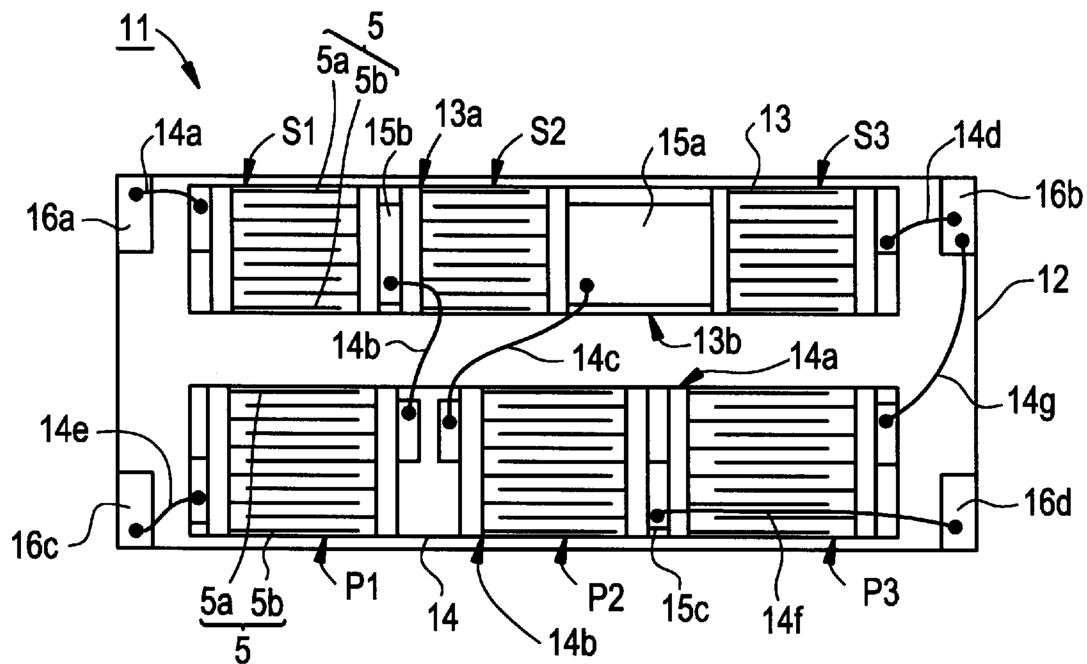
FIG. 3A is a plan view of a ladder filter according to a first example of a first preferred embodiment of the present invention.
Figure 3B:
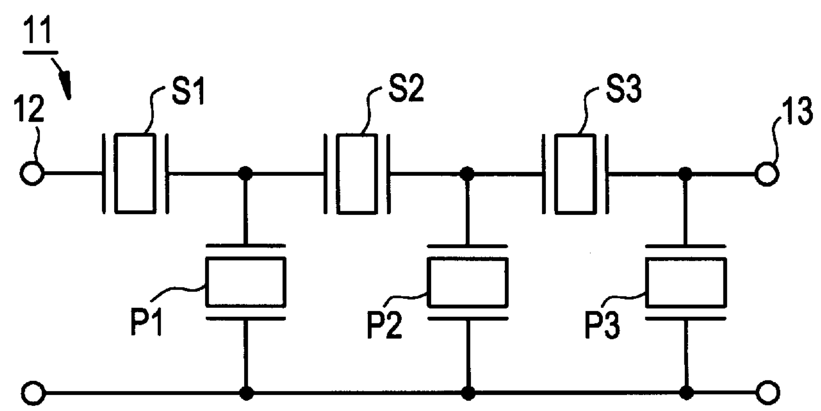
FIG. 3B is an equivalent circuit of the ladder filter shown in FIG. 3A.

FIG. 3A is a schematic plan view illustrating a ladder filter 11 according to a first example of a first preferred embodiment and FIG. 3B is an equivalent circuit of the ladder filter 11.

As shown in FIG. 3A, the ladder filter 11 includes a first piezoelectric substrate 13 having a pair of end surfaces 13*a* and 13*b* which are substantially parallel to each other and a second piezoelectric substrate 14 having a pair of end surfaces 14*a* and 14*b* which are substantially parallel to each other. The first piezoelectric substrate 13 and the second piezoelectric substrate 14 are disposed on a base 12. Although FIG. 3A shows that the substrates 13 and 14 are spaced apart from each other, it is preferable the space between the substrates 13 and 14 is small. It has been confirmed by the inventors that the ladder filter 11 can operate correctly even if the substrates 13 and 14 are in contact with each other. The base 12 usually composes a part of a package in which the first piezoelectric substrate 13 and the second piezoelectric substrate 14 are encased.

The ladder filter 11 further includes series arm resonators S1, S2, S3 and parallel arm resonators P1, P2, P3 each having the structure shown in FIG. 2. The series arm resonators S1, S2, S3 preferably have the same structure and frequency characteristics as each other, and parallel arm resonators P1, P2, P3 preferably, have the same structure and frequency characteristics as each other. The series arm resonators S1, S2, S3 have a resonant frequency which preferably is substantially same as an antiresonant frequency of the parallel arm resonators P1, P2, P3.

Each of the series arm resonators S1, S2, S3 is arranged at a portion of the first piezoelectric substrate 13 along a length direction of the first piezoelectric substrate 13. In addition, a pair of outermost electrode fingers 5*a* and 5*b* of the IDT 5 of each series arm resonator are flush with end surfaces 13*a* and 13*b* of the first piezoelectric substrate 13, respectively. The series arm resonators S1, S2, S3 are connected in series via conductive patterns 15*a* and 15*b* disposed on the first piezoelectric substrate 13, thereby defining a series arm of a ladder circuit.

In the same manner, each of the parallel arm resonators P1, P2, P3 is arranged at a portion of the second piezoelectric substrate 14 along a length direction of the second piezoelectric substrate 14. In addition, a pair of outermost electrode fingers 5*a* and 5*b* of each parallel arm resonator are flush with end surfaces 14*a* and 14*b* of the second piezoelectric substrate 14, respectively. The parallel arm resonators P2 and P3 are connected via a conductive pattern 15*c* disposed on the second substrate to form a first group. The parallel arm resonator P1 may be formed on a substrate separated from the second piezoelectric substrate 14 since the parallel arm resonator P1 does not have to be connected to the parallel arm resonator P2 or P3 via a conductive pattern.

As shown in FIG. 3A, the base 12 is provided with an input terminal 16*a,* an output terminal 16*b,* ground terminals 16*c* and 16*d.* One end of the series resonator S1 and one end of the series resonator S3 are respectively connected to the input terminal 16*a* and the output terminal 16*b* via bonding wires 14*a* and 14*d,* whereby the series arm of the series arm resonators S1, S2, S3 is connected between the input terminal 16*a* and the output terminal 16*b.* On the other hand, each of the parallel arm resonators P1, P2, P3 is connected in parallel by the bonding wires 14*b,* 14*c,* 14*e,* 14*f,* 14*g* between the series arm and the ground terminals 16*c,* 16*d* so that each parallel arm resonator is connected to the respective connection point between the series arm resonator.

In the ladder filter 11, the IDT 5 of the parallel arm resonators P1, P2, P3 preferably has a larger area than the area of the series arm resonators S1, S2, S3 so that parallel arm resonators P1, P2, P3 have a greater capacitance than that of the series arm resonators S1, S2, S3. This makes the attenuation of the stop band great. However, such a structure also makes the length of the group of series arm resonators S1, S2, S3 shorter than that of the parallel arm resonators P1, P2, P3 and requires the wires 14*a* and 14*d* to be long. Accordingly, the conductive pattern 15*a* is made long in the direction of the group of series arm resonators S1, S2, S3 so that the wires 14*a* and 14*d* can be made short.

According to the ladder filter of preferred embodiments of the present invention, each of the parallel arm resonators and series arm resonators include an edge-reflection SAW resonator having no grating reflectors. As a result, the ladder filter can be miniaturized greatly. In the case where the ladder filter has a quartz substrate, the area of the ladder filter can be reduced to one fifth of the size of the conventional ladder filter. In the case where the ladder filter has a $LiTaO_3$ substrate, the area of the ladder filter can be reduced to one third to one half that of the conventional ladder filter.

In addition, the reflection efficiency of the edge reflection is about 1.25 times as great as that of the grating reflector used in conventional devices. Thus, the ladder filter of the preferred embodiments of the present invention achieves excellent attenuation loss and bandwidth of the passband.

Furthermore, since the series arm resonators S1, S2, S3 and the parallel arm resonators P1, P2, P3 have the same structures, respectively, it is possible to integrate and arrange the series arm resonators S1, S2, S3 and the parallel arm resonators P1, P2, P3 in the respective piezoelectric substrates having a pair of end surfaces which are substantially parallel to each other. Thus the number of the components to be mounted on a base can be reduced, thereby reducing the manufacturing process and cost. This also makes it possible to use substrates made of different materials for the series arm resonators and the parallel arm resonators. For example, it is possible to use a substrate made of material having a larger dielectric constant for the parallel arm resonators and a substrate made of material having a small dielectric constant for the series arm resonators, thereby enabling reduction of the difference in area between the parallel arm resonators and the series arm resonators.

It is noted that, although the series arm resonators S1, S2, S3 and the parallel arm resonators P1, P2, P3 preferably have the same structures, respectively, the series arm resonators S1, S2, S3 or the parallel arm resonators P1, P2, P3 may have different structures to have different frequency characteristics. For example, it is possible to change the aperture of the IDT in the series arm resonators S1, S2, S3 or in the parallel arm resonators P1, P2, P3 or to provide split electrode fingers in the series arm resonators S1, S2, S3 or in the parallel arm resonators P1, P2, P3 while the distance between the pair of edges is unchanged in the series arm resonators S1, S2, S3 or in the parallel arm resonators P1, P2, P3.

Figure 4A:
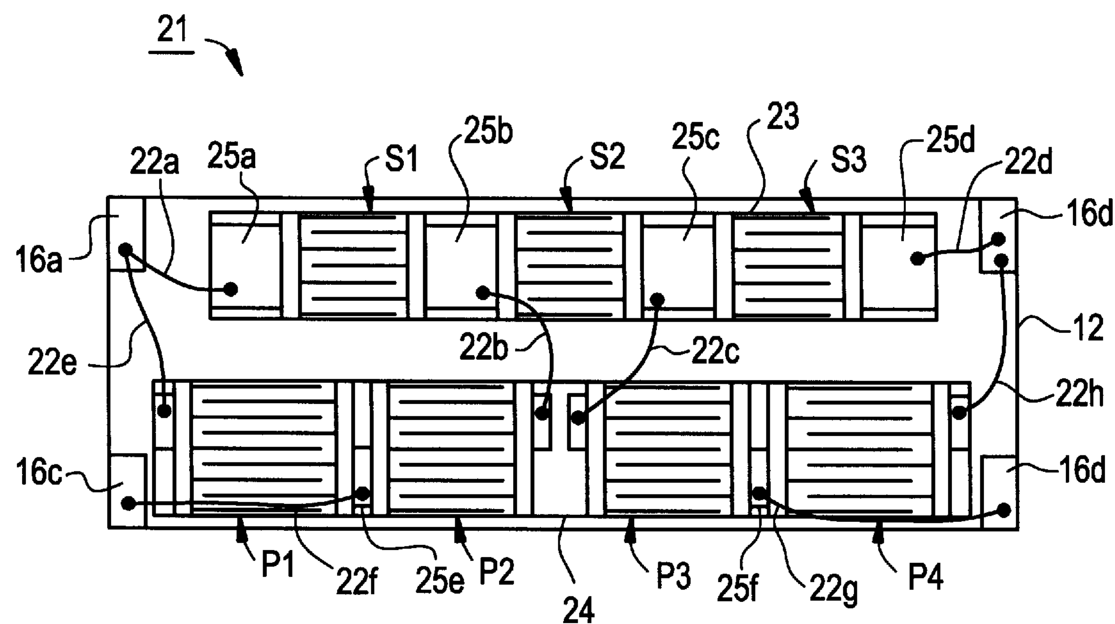
FIG. 4A is a plan view of a ladder filter according to a second example of the first preferred embodiment of the present invention.
Figure 4B:
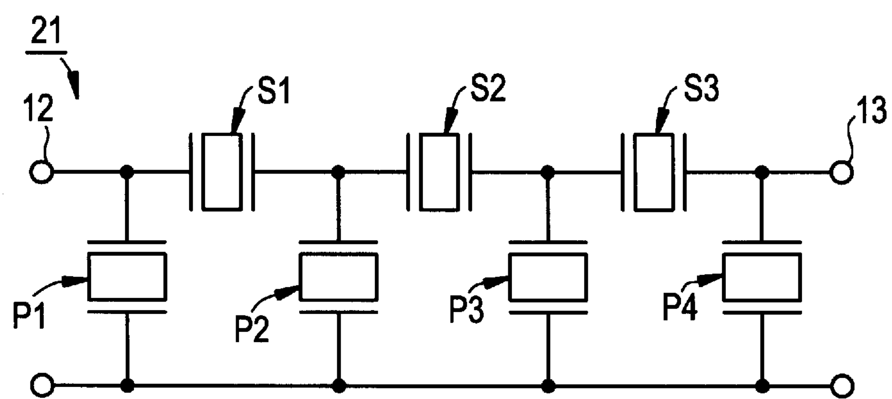
FIG. 4B is an equivalent circuit of the ladder filter shown in FIG. 4A.

FIG. 4A is a schematic plan view illustrating a ladder filter 21 according to a second example of the first preferred embodiment and FIG. 4B is an equivalent circuit of the ladder filter 21. In FIG. 4A, the same elements or corresponding elements as those in FIG. 3A are denoted with the same or like reference numerals.

As shown in FIG. 4A, the ladder filter 21 includes a first piezoelectric substrate 23, a second piezoelectric substrate 24, series arm resonators S1, S2, S3 and parallel arm resonators P1, P2, P3, P4 each having the structure shown in FIG. 2. The series arm resonators S1, S2, S3 preferably have a resonant frequency substantially which is the same as an antiresonant frequency of the parallel arm resonators P1, P2, P3, P4. Each of the series arm resonators S1, S2, S3 is arranged in a portion of the first piezoelectric substrate 23 in a length direction of the first piezoelectric substrate 23 in the same way as explained in connection with the first example. The series arm resonators S1, S2, S3 are connected in series by conductive patterns 25*b* and 25*c* disposed on the first piezoelectric substrate 23. Conductive patterns 25*a* and 25*d* also located at both end of the series connection of the series arm resonators S1, S2, S3. It is noted that the conductive patterns 25*a* to 25*d* are arranged to extend in the direction of the group of the series arm resonators S1, S2, S3 so that the wires 22*a* and 22*d* can be made short.

In the same manner, each of the parallel arm resonators P1, P2, P3, P4 is arranged at a portion of the second piezoelectric substrate 24 in a length direction of the second piezoelectric substrate 24. The parallel arm resonators P1 and P2 are connected by a conductive pattern 25*e* disposed on the second substrate to form a first group. The parallel arm resonators P3 and P4 are also connected by a conductive pattern 25*f* disposed on the second substrate to form a second group.

The parallel arm resonators P3 and P4 may be disposed on a substrate separated from the second piezoelectric substrate 24 since the parallel arm resonator P1 or P2 does not have to be connected to the parallel arm resonator P3 or P4 by a conductive pattern.

Bonding wires 22*a* and 22*d* are connected between the input terminal 16*a* and the conductive pattern 25*a* and between the output terminal 16*b* and the conductive pattern 25*d*. On the other hand, each of the parallel arm resonators P1, P2, P3, P4 is connected in parallel by the bonding wires 22*b*, 22*c*, 22*e*, 22*f*, 22*g*, 22*h* between the series arm and the ground terminals 16*c*, 16*d* so that each parallel arm resonator is connected to the respective connection point between the series arm resonator.

Figure 5A:
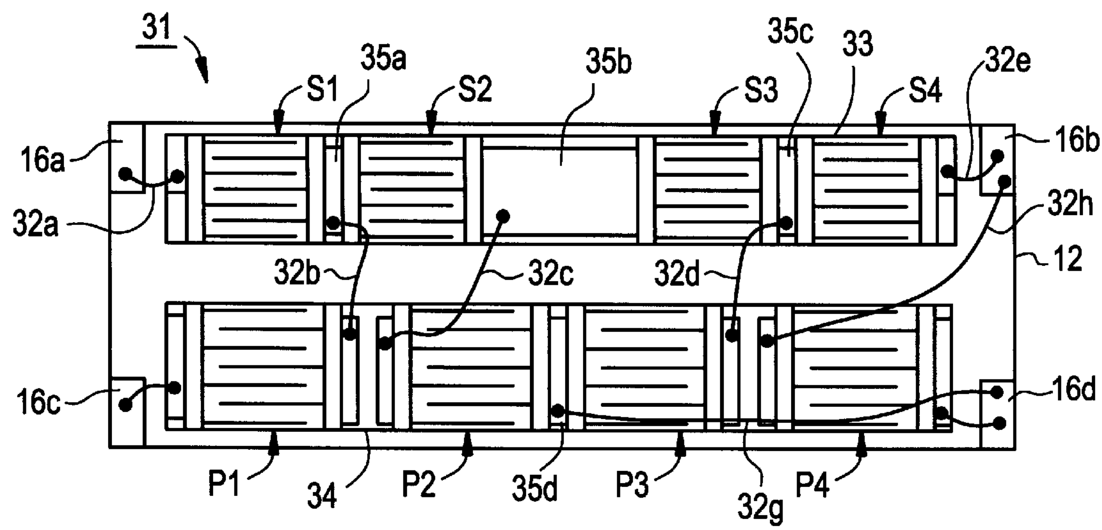
FIG. 5A is a plan view of a ladder filter according to a third example of the first preferred embodiment of the present invention.
Figure 5B:
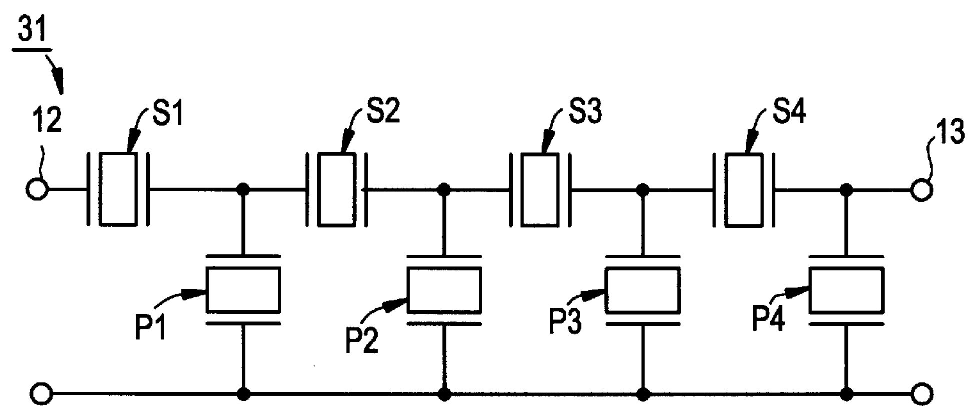
FIG. 5B is an equivalent circuit of the ladder filter shown in FIG. 5A.

FIG. 5A is a schematic plan view illustrating a ladder filter 31 according to a third example of the first preferred embodiment and FIG. 5B is an equivalent circuit of the ladder filter 31.

As shown in FIG. 5A, the ladder filter 31 includes a first piezoelectric substrate 33, a second piezoelectric substrate 34, series arm resonators S1, S2, S3, S4 and parallel arm resonators P1, P2, P3, P4 each having the structure shown in FIG. 2. The series arm resonators S1, S2, S3, S4 have a resonant frequency which is substantially same as an antiresonant frequency of the parallel arm resonators P1, P2, P3, P4. Each of the series arm resonators S1, S2, S3 is arranged at a portion of the first piezoelectric substrate 33 along a length direction of the first piezoelectric substrate 33 in the same way as explained in connection with the first example. The series arm resonators S1, S2, S3, S4 are connected in series via conductive patterns 35*a*, 35*b* and 35*c* located on the first piezoelectric substrate 33. It is noted that the conductive pattern 35*b* extends in the direction of the series of the series arm resonators S1, S2, S3, S4 so that the wires 32*a* and 32*e* can be made short.

In the same manner, each of the parallel arm resonators P1, P2, P3, P4 is arranged at a portion of the second piezoelectric substrate 34 along a length direction of the second piezoelectric substrate 34. The parallel arm resonators P2 and P3 are connected via a conductive pattern 35*d* disposed on the second substrate to form a first group.

The parallel arm resonators P1 and/or P4 may be disposed on a substrate which is physically separate from the second piezoelectric substrate 34 since the parallel arm resonator P1 or P4 does not have to be connected to the parallel arm resonator P2 or P3 by a conductive pattern.

Bonding wires 32*a* and 32*e* are connected between the input terminal 16*a* and one end of the series arm resonator S1 and between the output terminal 16*b* and one end of the series arm resonator S4. On the other hand, each of the parallel arm resonators P1, P2, P3, P4 is connected in parallel via the bonding wires 32*b*, 32*c*, 32*d*, 32*f*, 32*g*, 32*h*, 32*i* located between the series arm and the ground terminals 16*c*, 16*d* so that each parallel arm resonator is connected to the respective connection point between the series arm resonator.

Figure 6A:
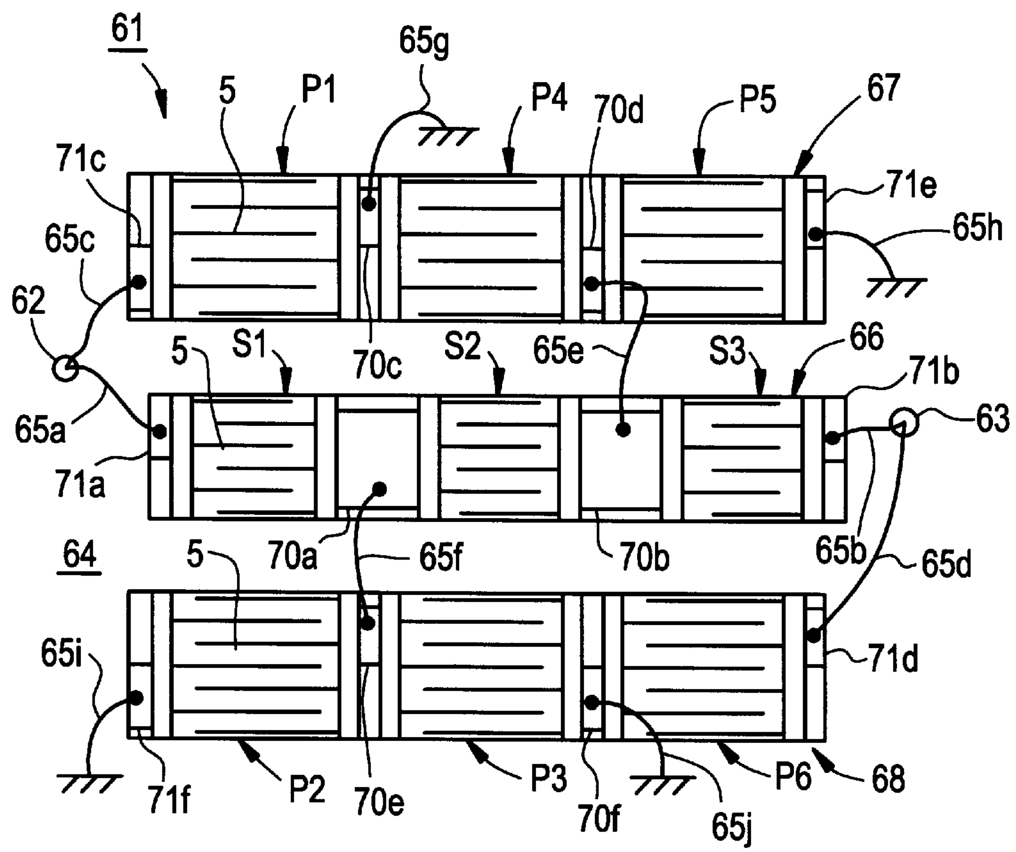
FIG. 6A is a plan view of a ladder filter according to a first example of a second preferred embodiment of the present invention.
Figure 6B:
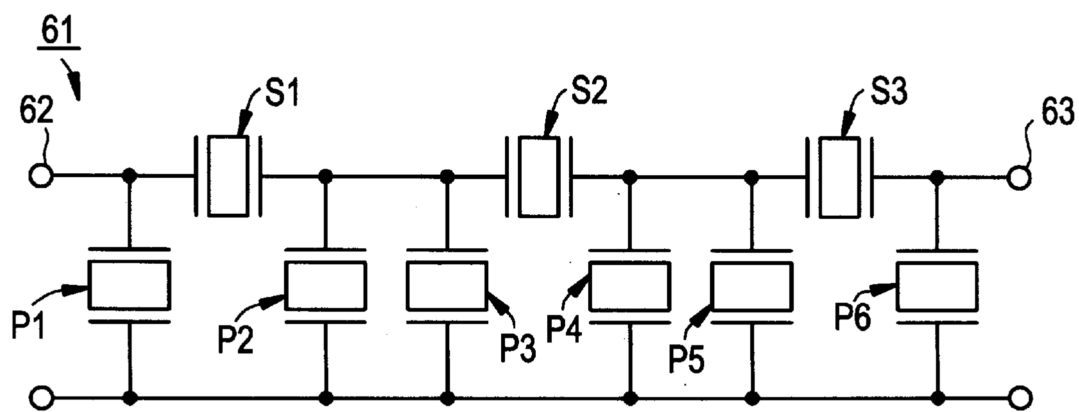
FIG. 6B is an equivalent circuit of the ladder filter shown in FIG. 6A.

FIG. 6A is a schematic plan view illustrating a ladder filter 61 according to a first example of a second preferred embodiment, and FIG. 6B is an equivalent circuit of the ladder filter 61.

As shown in FIG. 6A, the ladder filter 61 includes a first piezoelectric substrate 66, a second piezoelectric substrate 67 and a third piezoelectric substrate 68. The first piezoelectric substrate 66, the second piezoelectric substrate 67 and the third piezoelectric substrate 68 are disposed on a base 64, and the first piezoelectric substrate 66 is located between the second piezoelectric substrate 67 and the third piezoelectric substrate 68. Although FIG. 6A shows that the substrates 66, 67 and 68 are separate from each other, it is preferable that the spaces between the substrates 66, 67 and 68 are small so as to make the entire size of ladder filter 61 small. It has been confirmed by the inventors that the ladder filter 61 can operate correctly even if the substrates 66, 67 and 68 are in contact with each other.

The ladder filter 61 also includes series arm resonators S1, S2, S3 and parallel arm resonators P1, P2, P3, P4, P5, P6 each having the structure shown in FIG. 2. The series arm resonators S1, S2, S3 have a resonant frequency which is substantially the same as an antiresonant frequency of the parallel arm resonators P1, P2, P3, P4, P5, P6. Each of the series arm resonators S1, S2, S3 is arranged at a portion of the first piezoelectric substrate 66 along a length direction of the first piezoelectric substrate 66. An IDT 5 of each series arm resonator is disposed on the first piezoelectric substrate 66 in the same way as explained in the first preferred embodiment. The series arm resonators S1, S2, S3 are connected in series via conductive patterns 70*a* and 70*b* disposed on the first piezoelectric substrate 66, thereby defining a series arm of a ladder circuit. The conductive patterns 71*a* and 71*b* are disposed on one end of the series resonator S1 and one end of the series resonator S3. Bonding wires 65*a* and 65*b* are connected to an input terminal 62 and an output terminal 63, respectively so that the series arm of the series arm resonators S1, S2, S3 are connected between the input terminal 62 and the output terminal 63.

One of the features of the ladder filter 61 is that the parallel arm resonators P1 to P6 are disposed on two different substrates. Specifically, the parallel arm resonators P1, P4, P5 and the parallel arm resonators P2, P3, P6 form first and second groups, respectively and are arranged on the second piezoelectric substrate 67 and the third piezoelectric substrate 68, respectively. An IDT 5 of each parallel resonator is disposed on the second piezoelectric substrate 67 or the third piezoelectric substrate 68 in the same way as explained in the first preferred embodiment.

The parallel arm resonators P1, P4, P5 are connected in series via conductive patterns 70*c* and 70*d* located on the second piezoelectric substrate 67, and conductive patterns 71*c* and 71*e* are connected to one end of the parallel arm resonators P1 and one end of the parallel arm resonator P5. Bonding wires 65*c*, 65*g*, 65*e* and 65*h* are respectively connected between the input terminal 62 and the conductive pattern 71*c*, between the conductive pattern 70*c* and the ground potential, between the conductive pattern 70*b* on the first piezoelectric substrate 66 and the conductive pattern 70*d* and between the conductive pattern 71*e* and the ground potential. By these connections, the parallel arm resonators P1, P4, P5 are each connected in parallel between the series arm and the ground potential. In addition, the parallel arm resonators P4, P5 are connected between the connection point of the series resonators S2, S3 and the ground potential to form a π-type circuit.

In the same manner, the parallel arm resonators P2, P3, P6 are connected in series via conductive patterns 70*e* and 70*f* located on the second piezoelectric substrate 68, and conductive patterns 71*f* and 71*d* are connected to one end of the parallel arm resonators P2 and one end of the parallel arm resonator P6. Bonding wires 65*i*, 65*f*, 65*j*, 65*d* are respectively connected between the ground potential and the conductive pattern 71*f*, between the conductive pattern 70*a* on the first piezoelectric substrate 66 and the conductive pattern 70*e*, between the conductive pattern 70*f* and the ground potential and between the conductive pattern 71*d* and the output terminal 63. By these connections, the parallel arm resonators P2, P3, P6 are each connected in parallel between the series arm and the ground potential. In addition, the parallel arm resonators P2, P3 are connected between the connection point of the series resonators S1, S2 and the ground potential to form a π-type circuit.

According to the ladder filter 61, the plurality of parallel arm resonators are arranged on two separate substrates which are disposed on opposite sides of the substrate provided for the series arm resonators. Thus, although the number of parallel arm resonators increases, it is possible to prevent the longitudinal length of the substrate from increasing.

In addition, since the ladder filter 61 includes π-type circuits, the capacitance of the parallel arms is increased. Therefore, the attenuation of the stop band of the ladder filter is increased even more.

Consequently, it is possible to provide a ladder filter which is miniaturized and has excellent resonator characteristics.

Figure 7A:
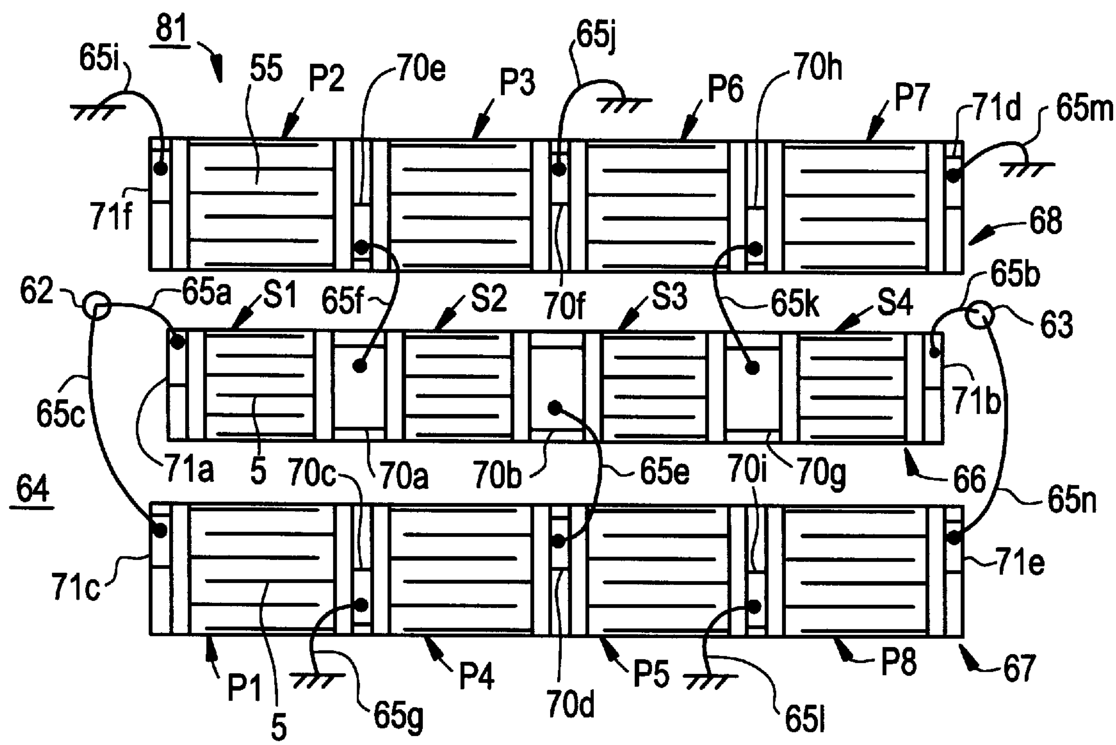
FIG. 7A is a plan view of a ladder filter according to a second example of a second preferred embodiment of the present invention.
Figure 7B:
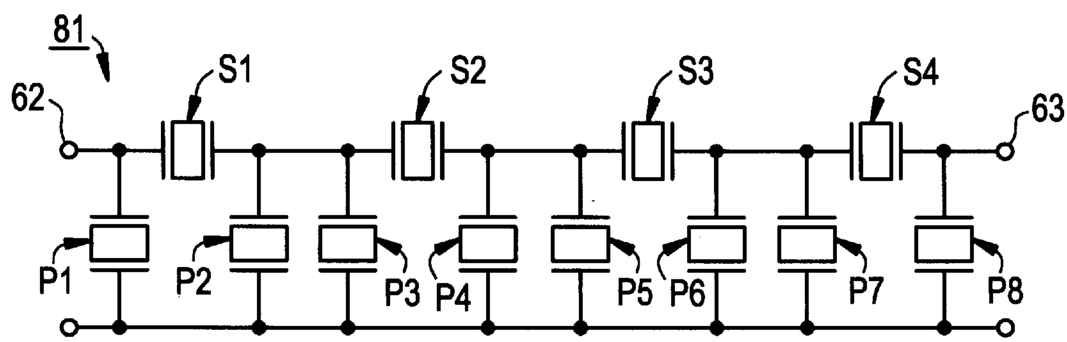
FIG. 7B is an equivalent circuit of the ladder filter shown in FIG. 7A.

FIG. 7A is a schematic plan view illustrating a ladder filter 81 according to a second example of the second preferred embodiment, and FIG. 7B is an equivalent circuit of the ladder filter 81.

As shown in FIG. 7A, the ladder filter 81 includes a first piezoelectric substrate 66, a second piezoelectric substrate 67 and a third piezoelectric substrate 68. The first piezoelectric substrate 66, the second piezoelectric substrate 67 and the third piezoelectric substrate 68 are disposed on a base 64, and the first piezoelectric substrate 66 is disposed between the second piezoelectric substrate 67 and the third piezoelectric substrate 68.

The ladder filter 81 further includes series arm resonators S1, S2, S3, S4 and parallel arm resonators P1, P2, P3, P4, P5, P6, P7, P8 each having the structure shown in FIG. 2. An IDT 5 of each series arm resonator is disposed on the first piezoelectric substrate 66 in the same way as explained in the first preferred embodiment. The series arm resonators S1, S2, S3, S4 are connected in series by conductive patterns 70*a*, 70*b*, 70*g* located on the first piezoelectric substrate 66, thereby forming a series arm of a ladder circuit. The conductive patterns 71*a* and 71*b* are located on one end of the series resonator S1 and one end of the series resonator S4. Bonding wires 65*a* and 65*b* are connected to an input terminal 62 and an output terminal 63, respectively so that the series arm of the series arm resonators S1, S2, S3, S4 is connected between the input terminal 62 and the output terminal 63.

The parallel arm resonators P1, P4, P5, P8 and the parallel arm resonators P2, P3, P6, P7 form first and second groups, respectively and are arranged on the second piezoelectric substrate 67 and the third piezoelectric substrate 68, respectively. An IDT 5 of each parallel resonator is disposed on the second piezoelectric substrate 67 or the third piezoelectric substrate 68 in the same way as explained in the first preferred embodiment.

The parallel arm resonators P1, P4, P5, P8 are connected in series through conductive patterns 70*c*, 70*d*, 70*i* located on the second piezoelectric substrate 67, and conductive patterns 71*c* and 71*e* are connected to one end of the parallel arm resonators P1 and one end of the parallel arm resonator P8. Bonding wires 65*c*, 65*g*, 65*e*, 65*i*, 65*h* are respectively connected between the input terminal 62 and the conductive pattern 71*c*, between the conductive pattern 70*c* and the ground potential, between the conductive pattern 70*b* on the first piezoelectric substrate 66 and the conductive pattern 70*d*, between the conductive pattern 70*i* and the ground potential and between the conductive pattern 71*e* and the output terminal 63. By these connections, the parallel arm resonators P1, P4, P5, P8 are each connected in parallel between the sires arm and the ground potential. In addition, the parallel arm resonators P4, P5 are connected between the connection point of the series resonators S2, S3 and the ground potential to form a π-type circuit.

In the same manner, the parallel arm resonators P2, P3, P6, P7 are connected in series through conductive patterns 70*e*, 70*f*, 70*h* disposed on the second piezoelectric substrate 68, and conductive patterns 71*f* and 71*d* are connected to one end of the parallel arm resonator P2 and one end of the parallel arm resonator P7. Bonding wires 65*i*, 65*f*, 65*j*, 65*k*, 65*m* are respectively connected between the ground potential and the conductive pattern 71*f*, between the conductive pattern 70*a* on the first piezoelectric substrate 66 and the conductive pattern 70*e*, between the conductive pattern 70*f* and the ground potential, between the conductive pattern 70*g* on the first piezoelectric substrate 66 and the conductive pattern 70*h* and between the conductive pattern 71*d* and the ground potential. By these connections, the parallel arm resonators P2, P3, P6 are each connected in parallel between the series arm and the ground potential. In addition, the parallel arm resonators P2, P3 and P6, P7 are respectively connected between the connection point of the series resonators S1, S2 and the ground potential and between the connection point of the series resonators S3, S4 and the ground potential to form a π-type circuit, respectively.

Figure 8A:
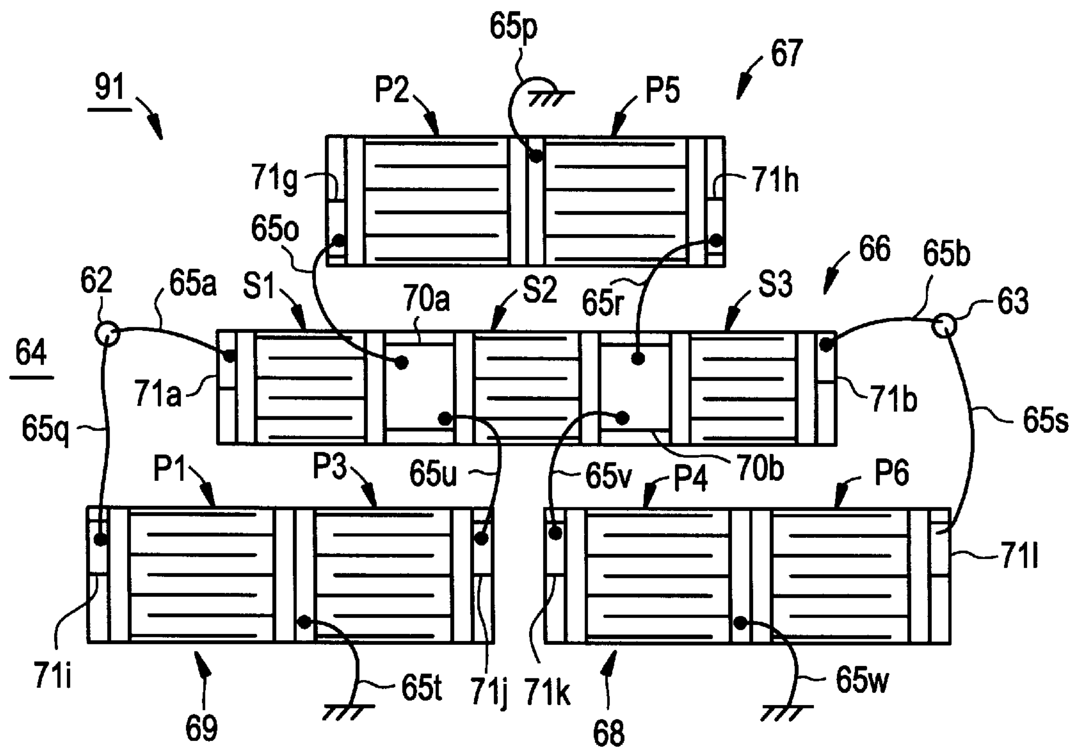
FIG. 8A is a plan view of a ladder filter according to a third example of a second preferred embodiment of the present invention.
Figure 8B:
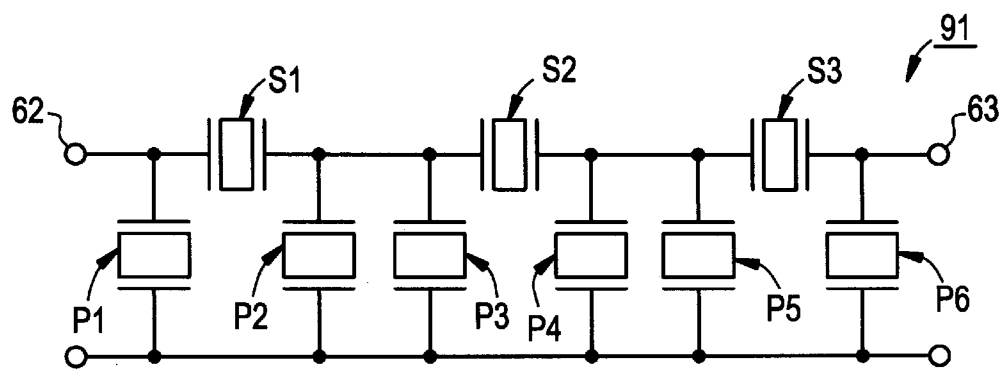
FIG. 8B is an equivalent circuit of the ladder filter shown in FIG. 8A.

FIG. 8A is a schematic plan view illustrating a ladder filter 91 according to a third example of a second preferred embodiment, and FIG. 8B is an equivalent circuit of the ladder filter 91.

As shown in FIG. 8A, the ladder filter 91 includes a first piezoelectric substrate 66, a second piezoelectric substrate 67, a third piezoelectric substrate 68 and fourth piezoelectric substrate 69. The first piezoelectric substrate 66, the second piezoelectric substrate 67, the third piezoelectric substrate 68 and the fourth piezoelectric substrate 69 are disposed on a base 64. The second piezoelectric substrate 67 is located on the side of one longitudinal side surface of the first piezoelectric substrate 66, and the third piezoelectric substrate 68 and the fourth piezoelectric substrate 69 are located on the side of the opposing longitudinal side surfaces of the first piezoelectric substrate 66. In addition, the third piezoelectric substrate 68 and the fourth piezoelectric substrate 69 are aligned in the longitudinal direction thereof.

The ladder filter 91 further includes series arm resonators S1, S2, S3 and parallel arm resonators P1, P2, P3, P4, P5, P6 each having the structure shown in FIG. 2. Each of the series arm resonators S1, S2, S3 is arranged at a portion of the first piezoelectric substrate 66 along a length direction of the first piezoelectric substrate 66. An IDT 5 of each series arm resonator is disposed on the first piezoelectric substrate 66 in the same way as explained in the first preferred embodiment. The series arm resonators S1, S2, S3 are connected in series via conductive patterns 70*a* and 70*b* located on the first piezoelectric substrate 66, thereby forming a series arm of a ladder circuit. The conductive patterns 71*a* and 71*b* are disposed on one end of the series resonator S1 and one end of the series resonator S3. Bonding wires 65*a* and 65*b* are connected to an input terminal 62 and an output terminal 63, respectively so that the series arm of the series arm resonators S1, S2, S3 are connected between the input terminal 62 and the output terminal 63.

The parallel arm resonators P2, P5, the parallel arm resonators P4, P6 and the parallel arm resonators P1, P3 form first, second and third groups, respectively and are arranged on the second piezoelectric substrate 67, the third piezoelectric substrate 68 and the fourth piezoelectric substrate 69, respectively. An IDT 5 of each parallel resonator is located on the second piezoelectric substrate 67, the third piezoelectric substrate 68 or the fourth piezoelectric substrate 69 in the same way as explained in the first preferred embodiment.

The parallel arm resonators P2, PS are connected in series by connecting one end of the IDTs 5 of the parallel arm resonators P2, P5 with each other, and conductive patterns 71*g* and 71*h* are connected to the other end of IDTs 5 of the parallel arm resonators P2, P5, respectively. Bonding wires 65*o*, 65*p*, 65*r* are respectively connected between the conductive pattern 70*a* on the first piezoelectric substrate 66 and the conductive pattern 71*g*, between the connection point of the IDTs 5 of the parallel arm resonators P2, P5 and the ground potential and between the conductive pattern 70*b* on the first piezoelectric substrate 66 and the conductive pattern 71*h*.

In the same way, the parallel arm resonators P4, P6 are connected in series by connecting one end of the IDTs 5 of the parallel arm resonators P4, P6 with each other, and conductive patterns 71*k* and 71*l* are connected to the other end of IDTs 5 of the parallel arm resonators P4, P6, respectively. Bonding wires 65*v*, 65*w*, 65*s* are respectively connected between the conductive pattern 70*b* on the first piezoelectric substrate 66 and the conductive pattern 71*k*, between the connection point of the IDTs 5 of the parallel arm resonators P4, P6 and the ground potential and between the output terminal 63 and the conductive pattern 711.

The parallel arm resonators P1, P3 are also connected in series by connecting one end of the IDTs 5 of the parallel arm resonators P1, P3, and conductive patterns 71*i* and 71*j* are connected to the other end of IDTs 5 of the parallel arm resonators P1, P3, respectively. Bonding wires 65*q*, 65*t*, 65*u* are respectively connected between the input terminal 62 and the conductive pattern 71*i*, between the connection point of the IDTs 5 of the parallel arm resonators P1, P3 and the ground potential and between the conductive pattern 71*j* and the conductive pattern 70*a* on the first piezoelectric substrate 66.

By these connections, the parallel arm resonators P1 to P6 are each connected in parallel between the series arm and the ground potential. In addition, the parallel arm resonators P2, P3 and P4, P5 are connected between the connection point of the series resonators S1, S2 and the ground potential and between the connection point of the series resonators S2, S3 and the ground potential to form a π-type circuit.

Figure 9:
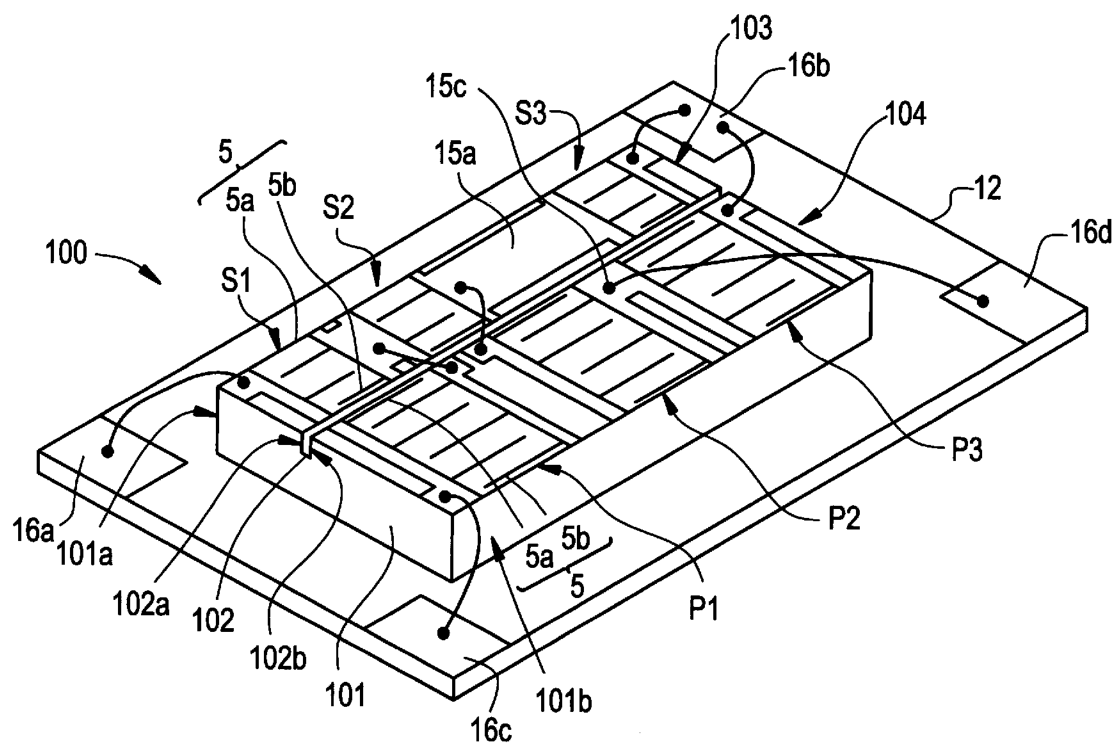
FIG. 9 is a perspective view of a ladder filter according to a first example of a third preferred embodiment of the present invention.

FIG. 9 is a perspective view illustrating a ladder filter 100 according to a first example of a third preferred embodiment. The ladder filter 100 is different from the ladder filter 11 shown in FIG. 3A in that the plurality of series arm resonators and parallel arm resonators are disposed on a single substrate. Thus, the elements which are the same as shown in FIG. 3A are denoted using the same reference numerals. The ladder filter 100 is also expressed by the same equivalent circuit shown in FIG. 3B.

As shown in FIG. 9, the ladder filter 100 includes a single piezoelectric substrate 101 having a pair of end surfaces 101*a* and 101*b* which are substantially parallel to each other. The piezoelectric substrate 101 has a groove structure 102 extending substantially parallel to the pair of end surfaces 101*a* and 101*b*. The groove structure 102 has side surfaces 102*a* and 102*b*, thereby defining a first main region 103 between the end surface 101*a* and the side surface 102*a* and a second main region 104 between the end surface 101*b* and the side surface 102*b*. The single piezoelectric substrate 101 is provided on a base 12.

The depth of the groove structure 102 is preferably about twice as great as a wavelength of the surface acoustic wave excited on the piezoelectric substrate 101 or more, and it is more preferable that the depth is about 2.5 times as great as a wavelength of the surface acoustic wave excited on the piezoelectric substrate 101 or more so as to prevent the surface acoustic wave excited on the first main region 103 from interfering with the surface acoustic wave on the second main region 104. On the other hand, the width of the groove structure 102 can be set at an arbitrary value.

Figure 10:
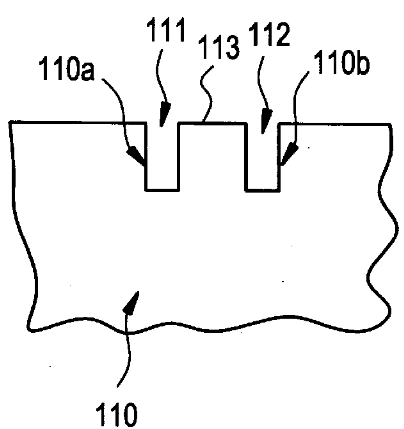
FIG. 10 is a cross sectional view of another example of the groove structure used in certain preferred embodiments of the present invention.

The groove structure 102 shown in FIG. 9 has a single groove, but may be formed in a different shape as long as the groove structure provides two side surfaces at the piezoelectric substrate 101. Specifically, a groove structure 110 shown in FIG. 10 may be formed in the piezoelectric substrate 101. The groove structure 110 includes grooves 111, 112 and a ridge 113 interposed therebetween. The groove 111 defines a side surface 110*a* and the groove 112 defines a side surface 110*b*.

In the ladder filter 100, each of the series arm resonators S1, S2, S3 is arranged at a portion of the first main region 103 along a length direction of the first main region 103. In addition, a pair of outermost electrode fingers 5*a* and 5*b* of the IDT 5 of each series arm resonator are flush with end surface 101*a* and side surface 102*a*, respectively.

In the same manner, each of the parallel arm resonators P1, P2, P3 is arranged at a portion of the second main region 104 along a length direction of the second main region 104. A pair of outermost electrode fingers 5*a* and 5*b* of each parallel arm resonator are flush with the side surface 102*b* and end surface 101*b*, respectively.

The ladder filter 100 preferably includes only one substrate 101 and the plurality of parallel and series arm resonators are integrated on the substrate 101. Thus, it is not necessary to mount a plurality of piezoelectric substrates on a base separately, and therefore, the mounting of the piezoelectric substrate on the base 12 can be simplified. In addition, the ladder filter 100 can be miniaturized even more.

Figure 11:
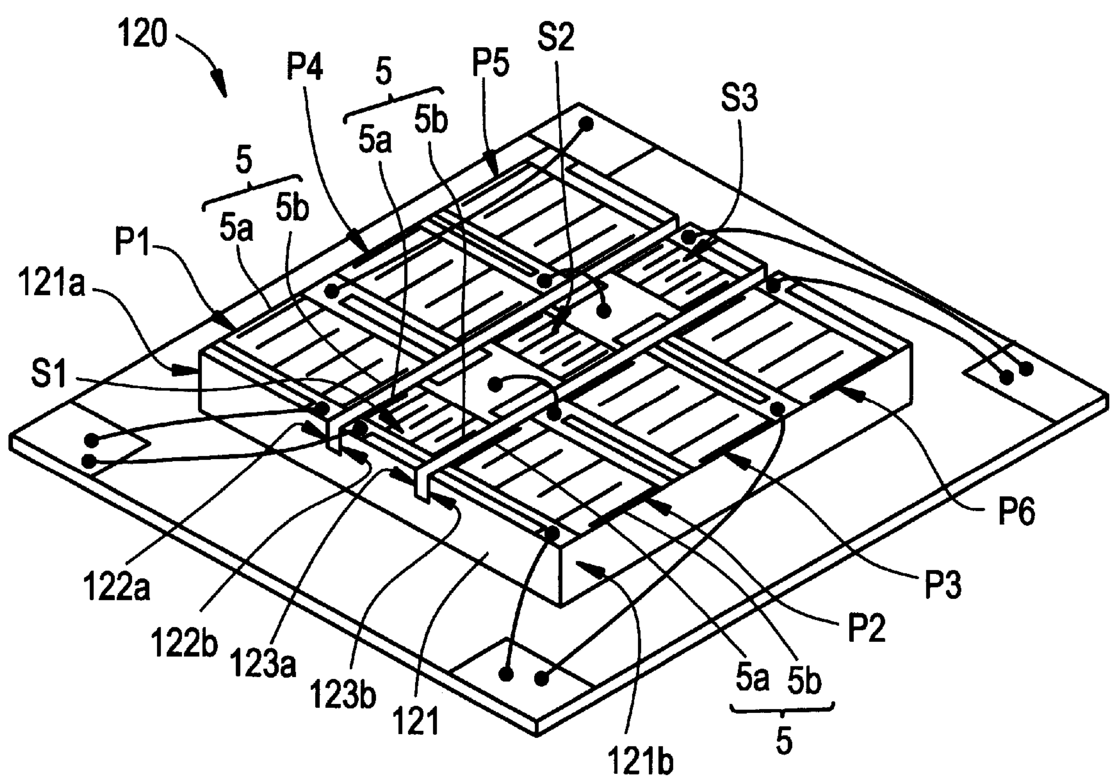
FIG. 11 is a perspective view of a ladder filter according to a second example of a third preferred embodiment of the present invention.

FIG. 11 is a perspective view illustrating a ladder filter 120 according to a second example of the third preferred embodiment. The ladder filter 120 is different from the ladder filter 61 shown in FIG. 6A in that the plurality of series arm resonators and parallel arm resonators are located on a single substrate. Thus, the elements which are the same as shown in FIG. 6A are denoted with the same reference numerals. The ladder filter 120 is also expressed by the same equivalent circuit shown in FIG. 6B.

As shown in FIG. 11, the ladder filter 121 includes a single piezoelectric substrate 120 having a pair of end surfaces 121*a* and 121*b* substantially parallel with each other. The piezoelectric substrate 121 has thereon a first groove structure 122 and a second groove structure 123 extending substantially parallel to the pair of end surfaces 121*a* and 121*b*. The first groove structure 122 has side surfaces 122*a* and 122*b*, and the second groove structure 123 has side surfaces 123*a* and 123*b*. As a result, a first main region 124 is defined between the side surface 122*b* and 123*a*. In the same manner, a second main region 125 and a third main region 126 are defined between the end surface 121*a* and the side surface 122*a* and between the end surface 121*b* and the side surface 123*b*, respectively.

In the ladder filter 120, each of the series arm resonators S1, S2, S3 is arranged at a portion of the first main region 124 in a length direction of the first main region 124. A pair of outermost electrode fingers 5*a* and 5*b* of the IDT 5 of each series arm resonator are flush with side surface 122*b* and side surface 123*a*, respectively.

In the same manner, each of the parallel arm resonators P1, P4, P5 is arranged at a portion of the second main region 125 in a length direction of the second main region 125. A pair of outermost electrode fingers 5*a* and 5*b* of each parallel arm resonator are flush with the end surface 121*a* and the side surface 122*a*, respectively. Each of the parallel arm resonators P2, P3, P6 is arranged in a portion of the third main region 126 in a length direction of the third main region 126. A pair of outermost electrode fingers 5*a* and 5*b* of each parallel arm resonator are flush with the side surface 123*b* and the end surface 121*b*, respectively.

Figure 12:
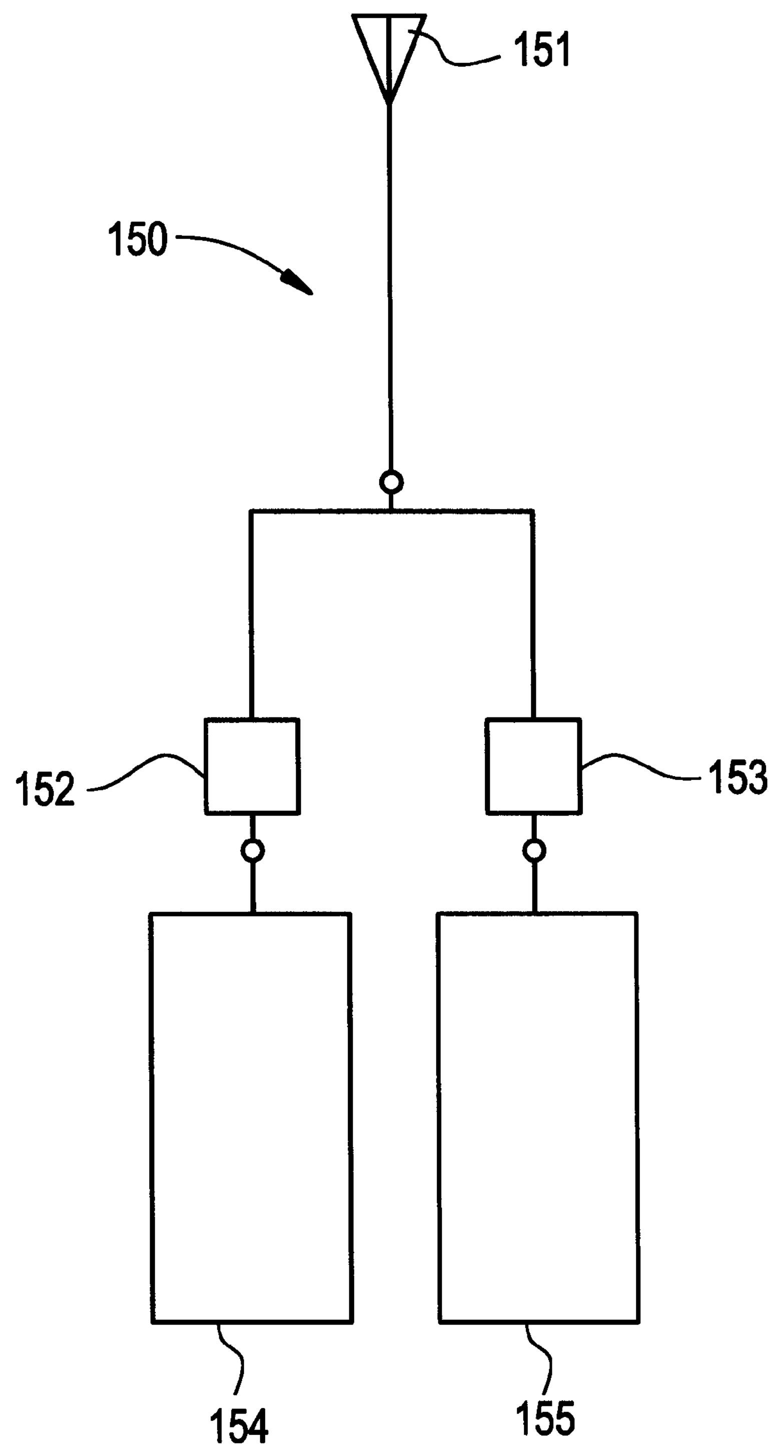
FIG. 12 is a schematic diagram of a communication apparatus according to another preferred embodiment of the present invention.

The ladder filter of preferred embodiments of the present invention can be suitably applied to various kinds of communication apparatuses which receive and/or transmit signals within two different frequency bands. FIG. 12 shows a diagram of one example of such a communication apparatus according to another preferred embodiment of the present invention.

A communication apparatus 150 shown in FIG. 12 includes an antenna 151, a first ladder filter 152, a second ladder filter 153, a first circuit 154 and a second circuit 155. The first ladder filter 152 is connected across the antenna 151 and the first circuit 154, and the second ladder filter 153 is connected across the antenna 151 and the second circuit 155.

The first and second ladder filters 152 and 153 are constructed according to the preferred embodiments of the present invention.

The first ladder filter 152 is designed such that the passband of the first ladder filter 152 corresponds to a frequency band of signals which the first circuit 154 processes. In the same manner, the second ladder filter 153 is designed such that the passband of the second ladder filter 153 corresponds to a frequency band of signals which the second circuit 155 processes. The first and second circuits 154 and 155 are either a receiver circuit or a transmitter circuit. In the case where both of the first and second circuits 154 and 155 are a receiver circuit or a transmitter circuit, the communication apparatus 150 is a dual band receiver or transmitter. In the case where one of the first and second circuit 154 and 155 is a transmitter circuit and the other is a receiver circuit, the communication apparatus 150 is a transceiver.

Although in the above-described preferred embodiments, the ladder filter including a particular number of the parallel arm resonators and the series arm resonators is illustrated. However, the numbers of the parallel arm resonators and the series arm resonators may be varied in accordance with the performance or specifications required of the ladder filter. Further, the ladder filter shown in FIGS. 4A, 5A, 7A or 8A can be incorporated with the third preferred embodiment.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A ladder filter comprising:

a plurality of series arm resonators connected in series to define a series arm of a ladder circuit and located at a first integrated region, each series arm resonator including an edge-reflection surface acoustic wave (SAW) resonator which includes a first piezoelectric material portion having a pair of edges and utilizes a shear horizontal surface acoustic wave excited on the first piezoelectric material portion; and a plurality of parallel arm resonators each connected in parallel between the series arm and a ground potential to define a parallel arm of a ladder circuit and including an edge reflection SAW resonator which includes a second piezoelectric material portion having a pair of edges thereof and utilizes a shear horizontal surface acoustic wave excited on the second piezoelectric material portion, the plurality of parallel arm resonators including a first group of at least two parallel arm resonators which are located at a second integrated region which is physically isolated from the first integrated region such that the shear horizontal surface acoustic wave excited on the piezoelectric material portion in the first integrated region does not interfere with the shear horizontal surface acoustic wave excited in the second integrated region.

2. A ladder filter according to claim 1, wherein the plurality of series arm resonators are arranged in the first integrated region such that the pair of edges of each series arm resonator are flush with the corresponding edges of the other series arm resonators, and the at least two parallel arm resonators of the first group are arranged such that the pair of edges of each parallel arm resonator of the first group is flush with the corresponding edges of the other parallel arm resonators of the first group.

3. A ladder filter according to claim 1, wherein the plurality of the parallel arm resonators further include a second group of at least two parallel arm resonators arranged at a third integrated region which has a third piezoelectric material portion and is physically isolated from the first and second integrated regions such that the shear horizontal surface acoustic wave excited on the third piezoelectric material portion in the third integrated region does not interfere with the shear horizontal surface acoustic wave excited in the first and second integrated regions.

4. A ladder filter according to claim 3, wherein the at least two parallel arm resonators of the second group are integrated such that the pair of edges of each parallel arm resonator of the second group are flush with the corresponding edges of the other parallel arm resonators of the second group.

5. A ladder filter according to claim 4, further comprising first, second and third single substrates made of piezoelectric material, wherein the first, second and third integrated regions are located on the first, second and third single substrates, respectively, and the first single substrate is arranged between the second single substrate and the third single substrate.

6. A ladder filter according to claim 4, further comprising a single substrate made of piezoelectric material and having two substantially parallel grooves thereon to divide the single substrate into three main regions, wherein the first integrated region is located at one of the main regions of the single substrate located between the two grooves, and the second and third integrated regions are located at the remaining two main regions of the single substrate, respectively.

7. A ladder filter according to claim 1, further comprising first and second single substrates made of piezoelectric material, wherein the first and second integrated regions are located on the first and second single substrates, respectively.

8. A ladder filter according to claim 1, further comprising a single substrate which is made of piezoelectric material and has a groove structure thereon to divide the single substrate into two main regions located on opposite sides of the groove structure, wherein each of the first and second integrated regions is located at one of the divided two main regions of the single substrate, respectively.

9. A communication apparatus comprising:

an antenna;

first and second circuits each being one of a receiving circuit and a transmitting circuit; and first and second ladder filters according to claim 1, the first and second ladder filters being connected between the antenna and the first circuit, and between the antenna and the second circuit, respectively, wherein the first and second ladder filters have passbands corresponding to frequency bands of signals which the first and second circuit process, respectively.

10. A ladder filter comprising:

a first piezoelectric substrate having a pair of end surfaces which are substantially parallel with each other;

a second piezoelectric substrate having a pair of end surfaces which are substantially parallel with each other;

a plurality of series arm resonators connected in series to define a series arm of a ladder circuit, each series arm resonator including a edge-reflection surface acoustic wave resonator which includes an interdigital transducer having a plurality of electrode fingers and utilizes a shear horizontal surface acoustic wave, the plurality of series arm resonators being arranged on the first piezoelectric substrate along a length direction of the first piezoelectric substrate such that a pair of outermost electrode fingers of each series arm resonator are flush with the pair of end surfaces of the first piezoelectric substrate, respectively; and a plurality of parallel arm resonators, each connected in parallel between the series arm and a ground potential to define a parallel arm of the ladder circuit and including an edge-reflection surface acoustic wave resonator which includes an interdigital transducer having a plurality of electrode fingers and utilizes a shear horizontal surface acoustic wave, the plurality of parallel arm resonators including a first group of at least two parallel arm resonators which are arranged on the second piezoelectric substrate along a length direction of the second piezoelectric substrate such that a pair of outermost electrode fingers of each parallel arm resonator of the first group are flush with the pair of end surfaces of the second piezoelectric substrate, respectively.

11. A ladder filter comprising according to claim 10, further comprising a third piezoelectric substrate having a pair of end surfaces substantially parallel to each other, wherein the plurality of parallel arm resonators includes a second group of at least two parallel arm resonators arranged on the third piezoelectric substrate along a length direction of the third piezoelectric substrate such that a pair of outermost electrode fingers of each parallel arm resonator of the second group are flush with the pair of end surfaces of the third piezoelectric substrate, respectively.

12. A ladder filter according to claim 11, wherein at least one pair of the parallel arm resonators are connected in parallel between a connection point of a pair of the series resonators and the ground potential to form a $\pi$-type circuit.

13. A ladder filter according to claim 11, wherein the first piezoelectric substrate is disposed between the second and third piezoelectric substrates.

14. A ladder filter according to claim 10, wherein the first piezoelectric substrate is made of a material different from that of the second piezoelectric substrate.

15. A ladder filter according to claim 10, wherein the interdigital transducer of at least one of the parallel arm resonators has an area larger than that of each series arm resonator.

16. A ladder filter comprising:

a piezoelectric substrate with a pair of end surfaces which are substantially parallel to each other and, the piezoelectric substrate having a groove structure extending substantially parallel to the pair of end surfaces so as to define first and second main regions between the pair of end surfaces of the piezoelectric substrate and corresponding side surfaces of the groove structure;

a plurality of series arm resonators connected in series to define a series arm of a ladder circuit, each series arm resonator including an edge-reflection surface acoustic wave resonator which includes an interdigital transducer having a plurality of electrode fingers and utilizes a shear horizontal surface acoustic wave, the plurality of series arm resonators being arranged on the first main region of the piezoelectric substrate along a length direction of the first main region such that a pair of outermost electrode fingers of each series arm resonator are flush with one of the end surfaces of the piezoelectric substrate and one of the side surfaces of the groove structure; and a plurality of parallel arm resonators, each connected in parallel between the series arm and a ground potential to define a parallel arm of the ladder circuit and including an edge-reflection surface acoustic wave resonator which includes an interdigital transducer having a plurality of electrode fingers and utilizes a shear horizontal surface acoustic wave, the plurality of parallel arm resonators including a first group of at least two parallel arm resonators which are arranged at the second main region of the piezoelectric substrate along a length direction of the second main region such that a pair of outermost electrode fingers of each parallel arm resonator of the first group are flush with the other end surface of the piezoelectric substrate and the other side surface of the groove structure.

17. A ladder filter according to claim 16, wherein the groove structure comprises two grooves and a ridge between the two grooves.

18. A ladder filter according to claim 16, wherein a depth of the groove structure is at least twice as great as a wavelength of a surface acoustic wave excited on the piezoelectric substrate.

19. A ladder filter according to claim 16, wherein the interdigital transducer of at least one of the parallel arm resonators has an area larger than that of each series arm resonator.

20. A ladder filter comprising:

a piezoelectric substrate having a pair of end surfaces which are substantially parallel to each other and, the piezoelectric substrate having first and second groove structures each of which has a pair of side surfaces, respectively and extend substantially parallel to the pair of end surfaces so as to define a first main region between the two groove structures, a second main region between one end surface of the piezoelectric substrate and the first groove structure and a third main region between the other end surface of the piezoelectric substrate and the second groove structure;

a plurality of series arm resonators connected in series to define a series arm of a ladder circuit, each series arm resonator including an edge-reflection surface acoustic wave resonator which includes an interdigital transducer having a plurality of electrode fingers and utilizes a shear horizontal surface acoustic wave, the plurality of series arm resonators being arranged on the first main region of the piezoelectric substrate along a length direction of the first main region such that a pair of outermost electrode fingers of each series arm resonator are flush with the respective side surfaces of the first and second groove structures; and a plurality of parallel arm resonators, each connected in parallel between the series arm and a ground potential to define a parallel arm of the ladder circuit and including an edge-reflection surface acoustic wave resonator which includes an interdigital transducer having a plurality of electrode fingers and utilizes a shear horizontal surface acoustic wave, the plurality of parallel arm resonators including a first group of at least two parallel arm resonators and a second group of at least two parallel arm resonators, the first group of the parallel arm resonators are arranged on the second main region of the piezoelectric substrate such that a pair of outermost electrode fingers of each parallel arm resonator of the first group are respectively flush with one of the end surfaces of the piezoelectric substrate and the other side surface of the first groove structure, the second group of the parallel arm resonators are arranged on the third main region of the piezoelectric substrate such that a pair of outermost electrode fingers of each parallel arm resonator of the second group are respectively flush with the other end surface of the piezoelectric substrate and the other side surface of the second groove structure.

21. A ladder filter according to claim 20, wherein the interdigital transducer of at least one of the parallel arm resonators has an area larger than that of each series arm resonator.

22. A ladder filter according to claim 20, wherein at least one of the first and second groove structures comprises two grooves and a ridge between the two grooves.

23. A ladder filter according to claim 20, wherein a depth of at least one of the first and second groove structures is at least twice as great as a wavelength of a surface acoustic wave excited on the piezoelectric substrate.

24. A ladder filter according to claim 20, wherein at least one pair of the parallel arm resonators are connected in parallel between a connection point of a pair of the series resonators and the ground potential to form a $\pi$-type circuit.

* * * * *

UNITED STATES PATENT AND TRADEMARK OFFICE

CERTIFICATE OF CORRECTION

PATENT NO. : 5,952,899

DATED : September 14, 1999

INVENTOR(S) : Michio Kadota; Takeshi Nakao; Toshimaro Yoneda; and Junya Ago

It is certified that error appears in the above-indentified patent and that said Letters Patent is hereby corrected as shown below:

On the Title Page, Item [75] Inventors, should read:

[75] Inventors: Michio Kadota, Kyoto; Takeshi Nakao, Nagaokakyo; Toshimaro Yoneda, Nagaokakyo; Junya Ago, Nagaokakyo, all of Japan Signed and Sealed this Third Day of April, 2001

*Attest:*

NICHOLAS P. GODICI

*Attesting Officer*

*Acting Director of the United States Patent and Trademark Office*